(12) United States Patent
Trivedi (10) Patent No.: US 6,818,997 B2
(45) Date of Patent: Nov. 16, 2004

(54) SEMICONDUCTOR CONSTRUCTIONS

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,886

(22) Filed: Aug. 27, 2002

(65) Prior Publication Data

US 2003/0137055 A1 Jul. 24, 2003

Related U.S. Application Data

(62) Division of application No. 10/056,263, filed on Jan. 23, 2002, now Pat. No. 6,548,401.

(51) Int. Cl.[7] .......................... H01L 29/40; H01L 23/48; H01L 29/00; C23F 1/00
(52) U.S. Cl. ........................ 257/774; 257/773; 257/758; 257/700; 257/701; 257/762; 257/529
(58) Field of Search ................................ 257/774, 773, 257/758, 700, 701, 762, 529, 751

(56) References Cited

U.S. PATENT DOCUMENTS

| | | | |
|---|---|---|---|
| 6,033,952 A | | 3/2000 | Yasumura et al. |
| 6,265,301 B1 | * | 7/2001 | Lee et al. .................... 438/618 |
| 6,342,446 B1 | * | 1/2002 | Smith et al. ................. 438/687 |
| 6,391,472 B1 | | 5/2002 | Lamb, III et al. |
| 6,495,452 B1 | * | 12/2002 | Shih ........................... 438/643 |
| 6,599,829 B2 | * | 7/2003 | Smith et al. ................. 438/636 |
| 2002/0074312 A1 | * | 6/2002 | Ou-Yang et al. .............. 216/39 |
| 2002/0127840 A1 | * | 9/2002 | Smith et al. ................. 438/618 |
| 2002/0132474 A1 | * | 9/2002 | Ahn et al. .................... 438/643 |
| 2002/0137339 A1 | * | 9/2002 | Takeuchi .................... 438/688 |
| 2003/0001273 A1 | * | 1/2003 | Steiner et al. ............... 257/760 |
| 2003/0011042 A1 | * | 1/2003 | Kagiwata .................... 257/529 |
| 2003/0166345 A1 | * | 9/2003 | Chang ......................... 438/717 |
| 2003/0201543 A1 | * | 10/2003 | Cheng et al. ................ 257/774 |
| 2004/0005782 A1 | * | 1/2004 | Shih et al. ................... 438/694 |

FOREIGN PATENT DOCUMENTS

| | | | | |
|---|---|---|---|---|
| JP | 6-283525 | * | 10/1994 | ................. 438/624 |
| JP | 2000-58642 | * | 2/2000 | |

OTHER PUBLICATIONS

Watanabe, H. et al., "Novel 0.44 $\mu m^2$ Ti–Salicide STI Cell Technology for High–Density NOR Flash Memories and High Performance Embedded Application", IEEE 1998, pp. 36.2.1 • 36.2.4.

Wolf, S., "Silicon Processing for the VLSI Era", vol. 2, pp. 632–635.

Mitsubishi Electric Website: Reprinted from website http://www. mitsubishielectric.com/r and d/tech showcase/ts8.php on Mar. 29, 2001: "8. Production Line Application of a Fine Hole Pattern–Formation Technology for Semiconductor", on Mar. 29, 2001, 4 pgs.

Cahners Semiconductor International Website: Reprinted from http://www.semiconductor.net/semiconductor/issues/1999/sep99/docs/feature1.asp on Mar. 29, 2001: "Resists Join the Sub–λ Revolution", 9 pgs.

Cahners Semiconductor International Website: Reprinted from http://www.semiconductor.net/semiconductor/Issues/1999/aug99/docs/lithography.asp on Mar. 29, 2001: "Paths to Smaller Features", 1 pg.

* cited by examiner

Primary Examiner—Alexander Oscar Williams
(74) Attorney, Agent, or Firm—Wells St. John P.S.

(57) ABSTRACT

The invention includes a dual-damascene semiconductor processing method. A semiconductor substrate is provided, and the substrate includes a conductive structure and an insulative layer over the conductive structure. A via is etched through the insulative layer and into the conductive structure, and a resist is formed within the via. A material is formed over the resist and substrate. A portion of the material in contact with the resist is hardened, and another portion of the material that does not contact the resist is not hardened. The portion of the material which is not hardened is removed, and a slot is etched into the insulative layer.

16 Claims, 6 Drawing Sheets

_Fig. 5_
PRIOR ART

_Fig. 6_

SEMICONDUCTOR CONSTRUCTIONS

This patent resulted from a divisional application of U.S. patent application Ser. No. 10/056,263, which was filed on Jan. 23, 2002, now U.S. Pat. No. 6,548,401.

TECHNICAL FIELD

The invention pertains to semiconductor processing methods and semiconductor constructions. In particular aspects, the invention pertains to dual-damascene processing methods, and to structures formed during dual-damascene semiconductor processing methods.

BACKGROUND OF THE INVENTION

Semiconductor processing frequently involves formation of an electrical contact to a conductive structure. For instance, semiconductor devices frequently comprise a substrate having numerous electrical components supported therein and thereover, and above the electrical components are provided one or more metal layers. The metal layers can electrically connect the components to one another, and can be further utilized to electrically connect circuitry associated with a semiconductor device to other circuitry external of the device. The metal layers can be referred to as a metal I layer, metal II layer, metal III layer, metal IV layer, etc; with the numeric designation indicating the approximate level of the metal layer relative to the semiconductor circuit components. For instance, the first metal layer formed over the components will typically be referred to as a metal I layer, and the various other layers formed over the metal I layer will be numbered in ascending, sequential order. Electrical contacts are ultimately to be formed to electrically connect the various metal layers to one another, as well as to electrically connect the metal layers with the circuit components of the semiconductor device.

One method of forming electrical interconnects between elevationally separated conductive components is a damascene process. An exemplary damascene process is described with reference to FIGS. 1–5.

Figure 1:
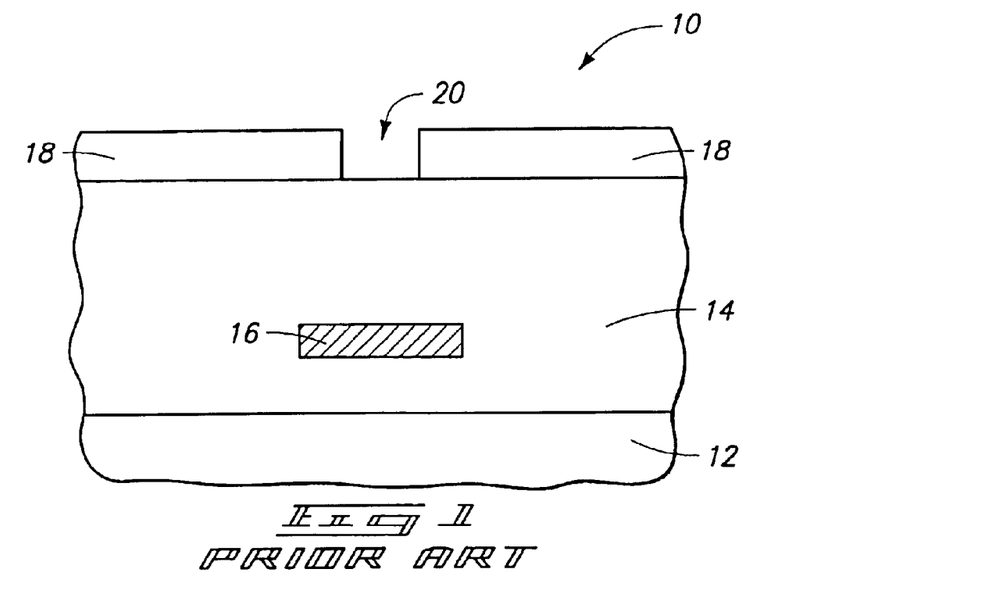
FIG. 1 is a diagrammatic, cross-sectional view of a fragment of a semiconductor wafer construction at a preliminary processing step of a prior art method.

Referring initially to FIG. 1, a fragment of a semiconductor construction 10 is illustrated. The fragment comprises a semiconductor substrate 12 having an insulative mass 14 thereover. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In exemplary constructions, substrate 12 can comprise various conductive, semiconductive, and insulative semiconductor device components (not shown), in addition to monocrystalline silicon.

Insulative mass 14 can comprise, for example, borophosphosilicate glass (BPSG).

A conductive structure 16 is illustrated to be supported within insulative mass 14. Conductive structure 16 can comprise a semiconductor device component, or alternatively can comprise a metal layer, such as, for example, a metal I layer.

A patterned masking material 18 is formed over insulative mass 14. Masking material 18 can comprise, for example, photoresist, and can be patterned into the shown shape utilizing photolithographic processing methods. Patterned masking material 18 has an opening 20 extending therethrough, which exposes a portion of insulative mass 14.

Figure 2:
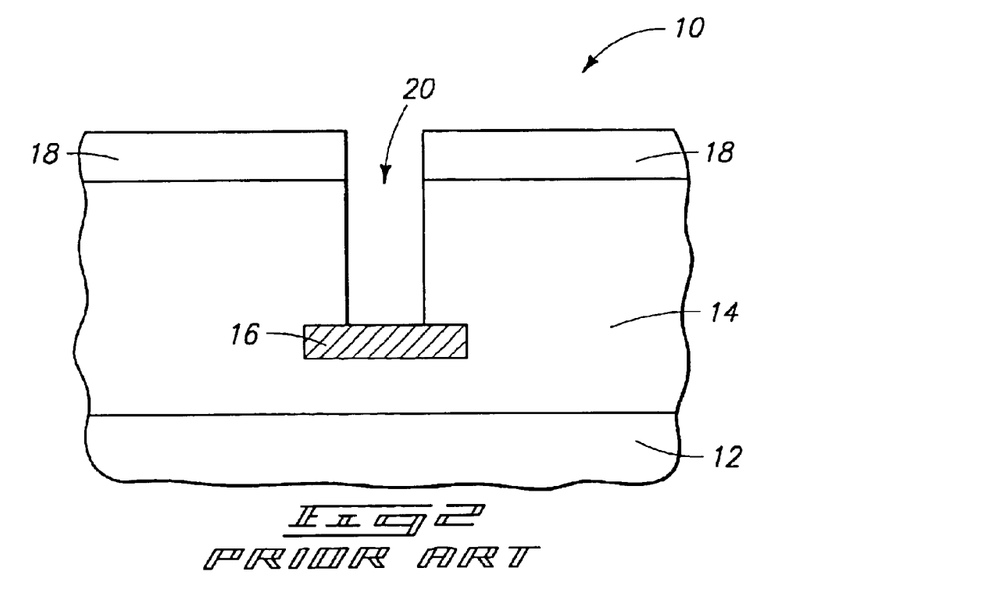
FIG. 2 is a view of the FIG. 1 fragment shown at a prior art processing step subsequent to that of FIG. 1.

Referring to FIG. 2, the exposed portion of insulative mass 14 is removed to extend opening 20 to conductive structure 16.

Figure 3:
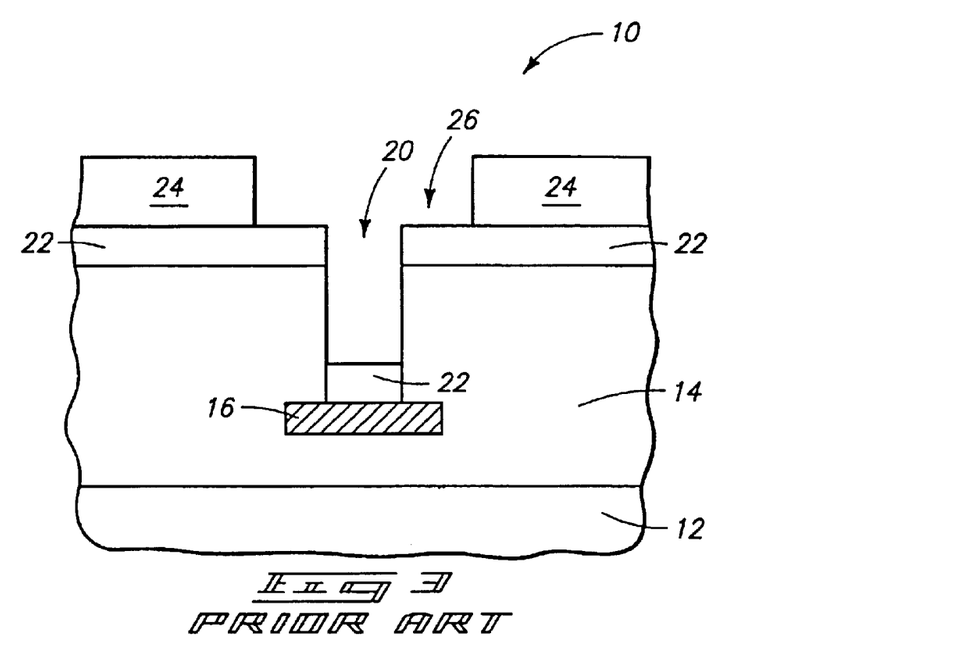
FIG. 3 is a view of the FIG. 1 fragment shown at a prior art processing step subsequent to that of FIG. 2.

Referring to FIG. 3, masking layer 18 (FIG. 2) is removed, and a sacrificial, protective material 22 is formed across an upper surface of mass 14 and within opening 20. Material 22 can comprise, for example, anti-reflective coating (ARC) materials, such as, for example, bottom anti-reflective coating (BARC) materials. An exemplary BARC is DUV 42P, available from Brewer Science Corporation. Material 22 can be considered to comprise a first portion on an upper surface of mass 14, and a second portion within opening 20.

After formation of protective material 22, a patterned masking layer 24 is formed over the first portion of material 22. Masking layer 24 can comprise, for example, photoresist, and can be patterned by photolithographic processing. Material 24 defines a second opening 26 which overlaps with the first opening 20.

Figure 4:
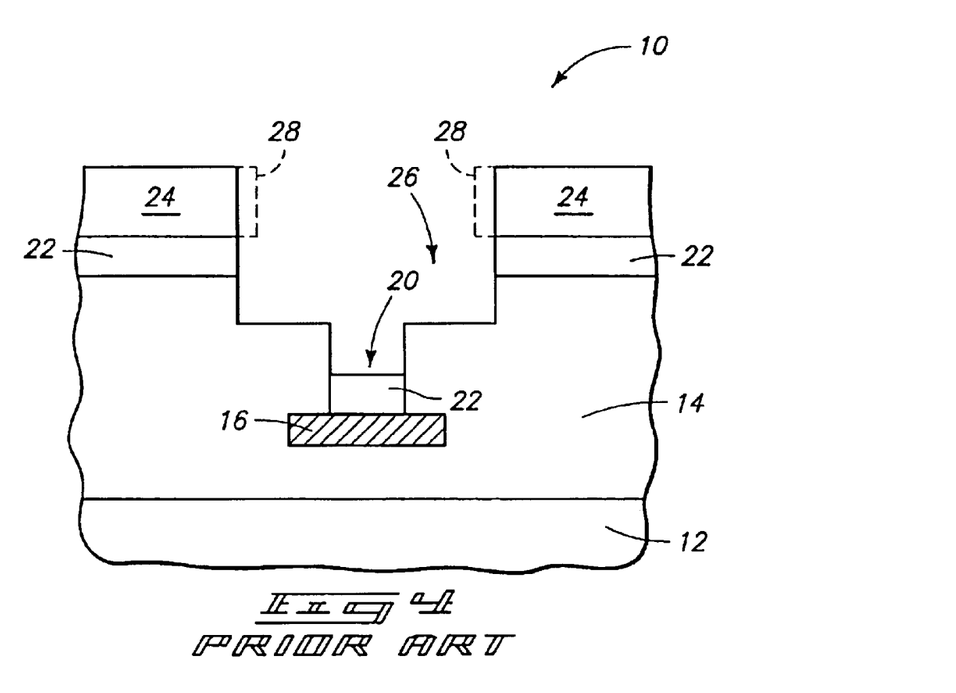
FIG. 4 is a view of the FIG. 1 fragment shown at a prior art processing step subsequent to that of FIG. 3.

Referring to FIG. 4, an etch is conducted to extend second opening 26 through the first portion of protective material 22 and into mass 14. The second portion of material 22 within opening 20 protects conductive structure 16 from being exposed to the etching conditions. A difficulty can occur during the etch in attempting to remove the first portion of protective material 22 that is over mass 14. Specifically, it is difficult to find an etch which is selective for ARC or BARC relative to photoresist masking layer 24, and accordingly some of the masking layer 24 is removed during the etch. Such removal of masking layer 24 is illustrated by dashed lines 28 which show the starting position of material 24, and illustrate that material 24 has retreated from opening 26 during the etch of material 22. Such causes a widening of opening 26, and hence an increase in the critical dimension of opening 26. The widening of opening 26 also decreases a space between opening 26 and an adjacent opening or feature (not shown). A continuing goal in semiconductor processing is to reduce a footprint of various devices relative to a semiconductor substrate in order to conserve valuable semiconductor real estate. The increase in the critical dimension of opening 26 is therefore not desired.

Figure 5:
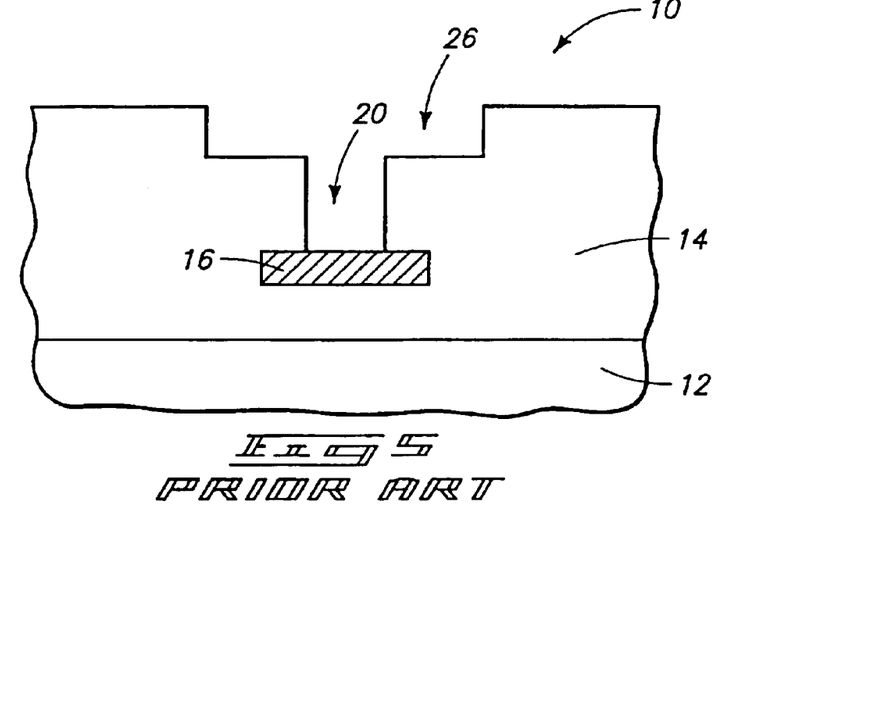
FIG. 5 is a view of the FIG. 1 fragment shown at a prior art processing step subsequent to that of FIG. 4.

Referring to FIG. 5, materials 22 and 24 (FIG. 4) are removed from over mass 14 and conductive structure 16. A difficulty can occur in removing BARC and ARC materials, in that polymers can be formed which deposit over conductive material 16, and which are difficult to selectively remove relative to conductive material of structure 16. For instance, structure 16 will frequently comprise, consist essentially of, or consist of copper; and it can be difficult to remove polymeric materials relative to copper without having at least some etching into the copper. The etching into the copper can detrimentally effect performance of circuitry utilizing conductive structure 16.

After removal of materials 22, and 24, the openings 20 and 26 can be filled with a suitable conductive material (not shown) to form an interconnect to conductive structure 16. In particular embodiments, opening 20 will be a via which extends to conductive structure 16, and opening 26 will be a slot. Accordingly, conductive material formed within openings 26 and 20 comprises a conductive line within slot 26 which is electrically connected to conductive structure 16 through a conductive interconnect defined by the conductive material formed within via 20.

SUMMARY OF THE INVENTION

In one aspect, the invention encompasses a dual-damascene semiconductor processing method. A semiconductor substrate is provided. The substrate includes a conductive structure and an insulative layer over the conductive structure. A via is etched through the insulative layer and into the conductive structure, and a resist is formed within the via. A material is formed over the resist and substrate. A portion of the material in contact with the resist is hardened, and another portion of the material that does not contact the resist is not hardened. The portion of the material which is not hardened is removed, and a slot is etched into the insulative layer. The resist and hardened portion of the material protect the conductive structure during the etching of the slot.

In another aspect, the invention encompasses a semiconductor processing method in which a first opening is formed to extend into a substrate. The first opening has a periphery at least partially defined by the substrate. A mass is formed within the first opening to only partially fill the first opening. A material is formed over the mass and within the partially-filled opening. At least one substance is released from the mass, and such substance forms chemical cross-links within the material. After the chemical cross-links are formed, at least some of the periphery of the first opening is removed to form a second opening. After the second opening is formed, the mass and cross-linked material are removed from the first opening.

In yet another aspect, the invention encompasses a semiconductor construction. The construction includes a semiconductor substrate which comprises a conductive mass and an insulative mass over the conductive mass. An opening extends through the insulative mass and to the conductive mass. A first organic material is formed within the opening and covers the conductive mass. The first organic material only partially fills the opening. A second organic material is within the partially-filled opening and over the first organic material. The second organic material is different than the first organic material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention encompasses improved methods performing protective materials over structures during semiconductor processing, and in particular aspects encompasses improved dual-damascene processes. A method of the present invention is described with references to FIGS. 6–12. In referring to FIGS. 6–12, similar numbering will be used as was utilized above in describing the prior art methodology of FIGS. 1–5, where appropriate.

Figure 6:
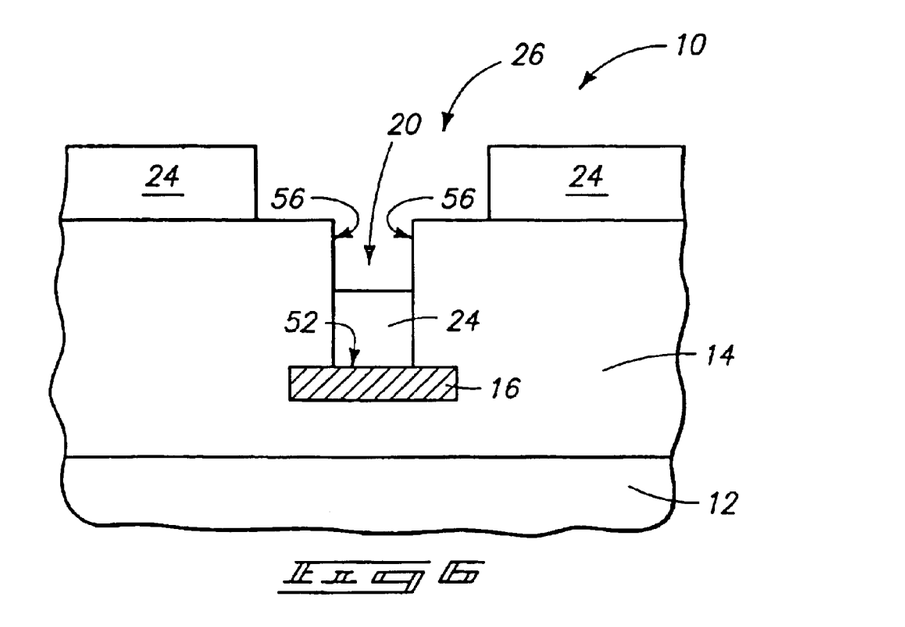
FIG. 6 is diagrammatic, cross-sectional view of a fragment of a semiconductor wafer construction shown at a preliminary processing step of a method of the present invention. The processing step of FIG. 6 can follow the prior art processing step of FIG. 2.

Referring initially to FIG. 6, a fragment of a semiconductor wafer construction 10 is illustrated at a processing step subsequent to the prior art processing of FIG. 2. Construction 10 comprises a substrate 12 having an insulative layer 14 thereover. An opening 20 extends through insulative layer 14 and to a conductive structure 16. Opening 20 has a periphery which includes a bottom surface 52 and sidewall surfaces 56. Surface 52 is shown to be comprised by conductive structure 16, and sidewall surfaces 56 are shown to comprise insulative material of mass 14.

The patterned masking material 18 (FIG. 2) has been removed, and a masking material 24 has been formed over mass 14 and within opening 20 to partially fill the opening. Masking material 24 of FIG. 6 has the same general shape as the material 24 of FIGS. 3 and 4 (and specifically defines an opening 26 over opening 20), and accordingly is given the same numeric designation (i.e., 24). Material 24 can be photoresist, as discussed above with reference to prior art FIGS. 3 and 4. In aspects of the present invention, material 24 can be an organic material, and only in particular embodiments is material 24 a resist, such as, for example, a photosensitive resist (i.e. a photoresist). Resist 24 can be sensitive to wavelengths of energy other than those associated with UV or visible light, and accordingly can be a material other than that traditionally thought of as a photoresist, such as, for example, a material sensitive to electron beam energy. A difference between FIG. 6 and FIG. 3 is that there is no BARC (layer 22 of FIG. 3) utilized in the FIG. 6 aspect of the present invention.

If material 24 of FIG. 6 is a photoresist material, it can be formed within opening 20 by initially providing the material over an entirety of construction 10 and subsequently utilizing appropriate photolithographic methodology to pattern the material. Photoresist material 24 can comprise either a positive or a negative photoresist. In particular aspects of the invention, material 24 can referred to as a mass provided within opening 20 and at least partially covering bottom surface 52 of the opening. In the shown embodiment, the material 24 is physically against the upper surface of conductive structure 16.

Conductive structure 16 can comprise a metal, such as, for example, copper. In particular embodiments, conductive structure 16 can consist essentially of, or consist of copper. Additionally, mass 24 can consist essentially of, or consist of either positive or negative photoresist.

Although the construction 10 in FIG. 6 has been described as comprising a semiconductor substrate 12 having insulative material mass 14 thereover, it is to be understood that the term "substrate" as utilized herein can also encompass the combination of materials 12 and 14. Accordingly, opening 20 can be considered as being an opening formed within a semiconductor substrate, and terminating on an upper surface of a conductive material 16 included within the semiconductor substrate.

Figure 7:
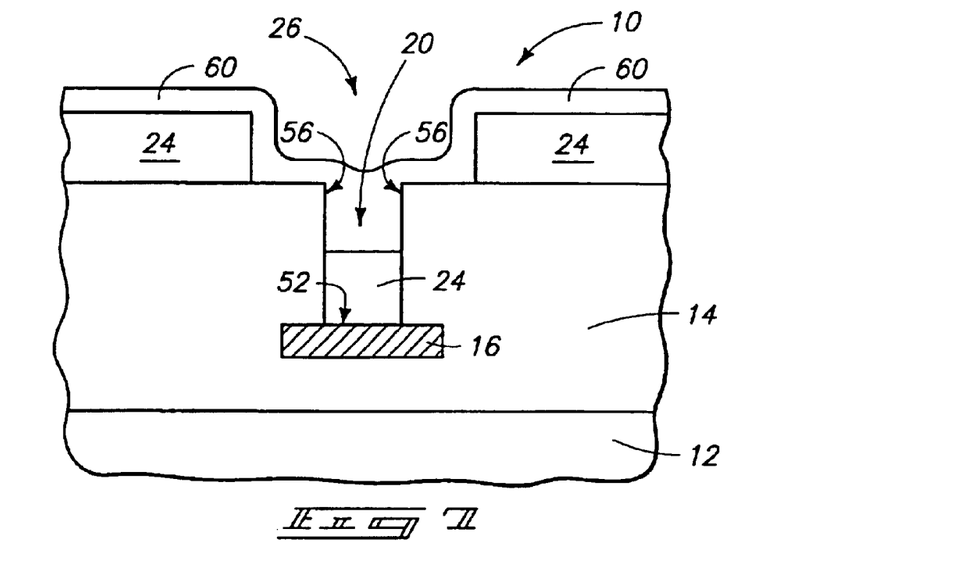
FIG. 7 is a view of the FIG. 6 fragment shown at a processing step subsequent to that of FIG. 6.

Referring to FIG. 7, a material 60 is formed over masses 14 and 24. In embodiments in which mass 24 comprises a first organic material, the substance 60 can comprise a second organic material. In preferred embodiments, mass 60 comprises a substance which can be selectively adhered over mass 24, and removed from over an upper surface of insulative material 14. For instance, in embodiments in which mass 24 comprises photoresist, substance 60 can comprise a composition designated as AZ R200™ by Clariant International, Ltd. Such composition can be spin-coated across an entirety of semiconductor wafer 10. A plurality of the openings 20 can be formed across a semiconductor wafer construction, and the composition will preferably uniformly fill the plurality of openings during the spin-coating of the composition over the wafer. Wafer 10 can then be baked in a temperature of from about 100° C. to about 120° C. Such baking can diffuse acid from resist 24 into the AZ R200™, and form chemical cross-links within portions of material AZ R200™ that are proximate mass 24. Such can cause a portion of material 60 in contact with mass 24 to be selectively hardened relative to other portions of material 60 that are not in contact with mass 24. Subsequently, material 60 can be subjected to conditions which selectively remove the coating which has not had chemical cross-links formed therein, while leaving the coating that is in contact with mass 24. Such removal can be accomplished by exposing semiconductor construction 10 to an aqueous solution comprising surfactant. A suitable aqueous surfactant solution is the material marketed as "SOLUTION C™" by Clariant International, Ltd. In applications in which AZ R200™ is utilized, construction 10 can be subjected to a so-called hard bake at a temperature of from about 100° C. to about 140° C. after removal of the non-cross linked material. Such hard bake can fully dry and further cross-link the portions of substance 60 remaining associated with photoresist mass 24.

It is noted that although the above-described embodiment specifically refers to a construction in which an acid is diffused from a photoresist mass 24 into the substance 60 to form chemical cross-links within the substance, the invention encompasses other embodiments in which substances other than acid are released from first mass 24 into second mass 60 to selectively alter chemical properties of a portion of mass 60 proximate mass 24, while leaving the chemical properties of other portions of substance 60 unchanged. The portions of substance 60 which are not proximate mass 24 can then be selectively removed relative to the portion proximate mass 24.

It is also noted that more than one substance can be released from within mass 24 to form chemical cross-links within substance 60, and in particular embodiments more than one acid can be released from a photoresist 24 to from the cross-links within a portion of substance 60 proximate mass 24.

Figure 8:
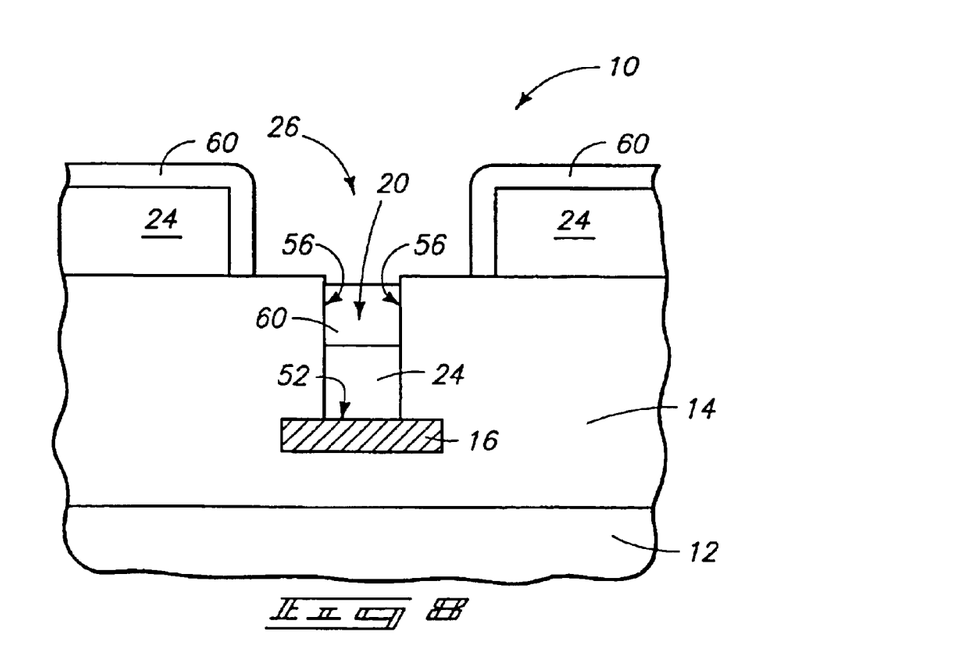
FIG. 8 is a view of the FIG. 6 fragment shown at a processing step subsequent to that of FIG. 7.

FIG. 8 illustrates construction 10 after portions of substance 60 which are not proximate mass 24 are selectively removed to leave only the portion of substance 60 proximate mass 24. The portion of substance 60 remaining proximate mass 24 narrows opening 26. In embodiments in which mass 24 comprises photoresist and substance 60 comprises AZ R200™, the portion of substance remaining within construction 10 can comprise chemical cross-links formed by diffusing acid from photoresist 24 into the AZ R200™. Mass 24 can be considered a first organic material, and mass 60 can be considered a second organic material which is different than mass 24. In the shown embodiment, both of masses 24 and 60 are within opening 20.

Figure 9:
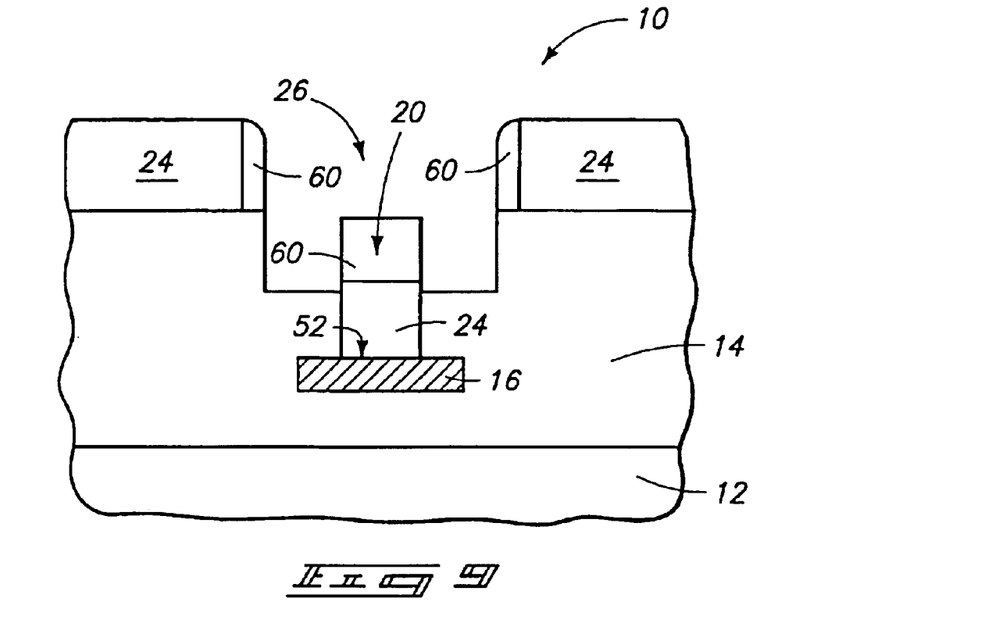
FIG. 9 is a view of the FIG. 6 fragment shown at a processing step subsequent to that of FIG. 8.

Referring to FIG. 9, narrowed opening 26 is extended into mass 14 with a suitable etch. More specifically, portions of the peripheral sidewalls 56 of opening 20 are removed to form a second opening corresponding to an extension of narrowed opening 26, and such second opening overlaps with the first opening 20. Materials 24 and 60 together define a plug which protects an upper surface of conductive structure 16 during the etching to extend second opening 26 into material 14.

The etch into material 14 is preferably substantially selective for the material 14 relative to one or both of photoresist 24 and material 60, and accordingly the problem of decreasing critical dimension described above with reference to prior art FIG. 4 is alleviated, and in particular embodiments eliminated, from processing of the present invention. It is easier to have reasonable selectivity between a BPSG mass 14 and one or both of photoresist 24 and mass 60 than is it to have selectivity between a BARC or ARC composition and photoresist 24. A suitable etch for BPSG 14 which is substantially selective for BPSG material 14 relative to photoresist 24 is an etch utilizing $CHF_3$ and/or $CH_2F_2$. It is noted, however, that even the above-described etch is not typically entirely selective for BPSG relative to photoresist and/or material 60, and therefore some amount of the photoresist and/or material 60 is typically removed during the etching to form opening 26 (such is shown in FIGS. 8 and 9 as removal of material 60 from over resist 24 in progressing from the stage of FIG. 8 to the stage of FIG. 9). The removal of the photoresist and/or material 60 is generally not problematic due to the isotropic nature of the etch, in that the etch will generally not extend into sidewalls of resist 24 and/or material 60, and in that resist 24 can be provided to be thick enough so that a desired amount of masking material remains over mass 14 during the entirety of the etch to form opening 26.

The removal of photoresist could be problematic, however, relative to photoresist 24 if protective mass 60 were not provided. Specifically, it is difficult to form a uniform amount of photoresist 24 within the numerous openings that would typically be present over a semiconductor wafer. Accordingly, some of the openings will have relative little photoresist formed therein, and others of the openings will have a significantly thicker amount of photoresist formed therein. The openings which have very little photoresist may have enough photoresist removed during the formation of opening 26 to expose an upper surface of conductive structure 16 to the etching conditions, which can adversely affect such exposed surface. An advantage of forming mass 60 over resist 24 is that the mass 60 can function as a protective cap over a photoresist mass 24. Specifically, mass 60 will preferably be less susceptible to the etch utilized for forming opening 26 than is mass 24. Accordingly, mass 60 protects the underlying photoresist mass 24 during the formation opening 26. Also, the combination of mass 60 and photoresist mass 24 can more uniformly fill a plurality of openings than can photoresist mass 24 alone, which can further provide protection for conductive structure 16 during etching of material 14.

Figure 10:
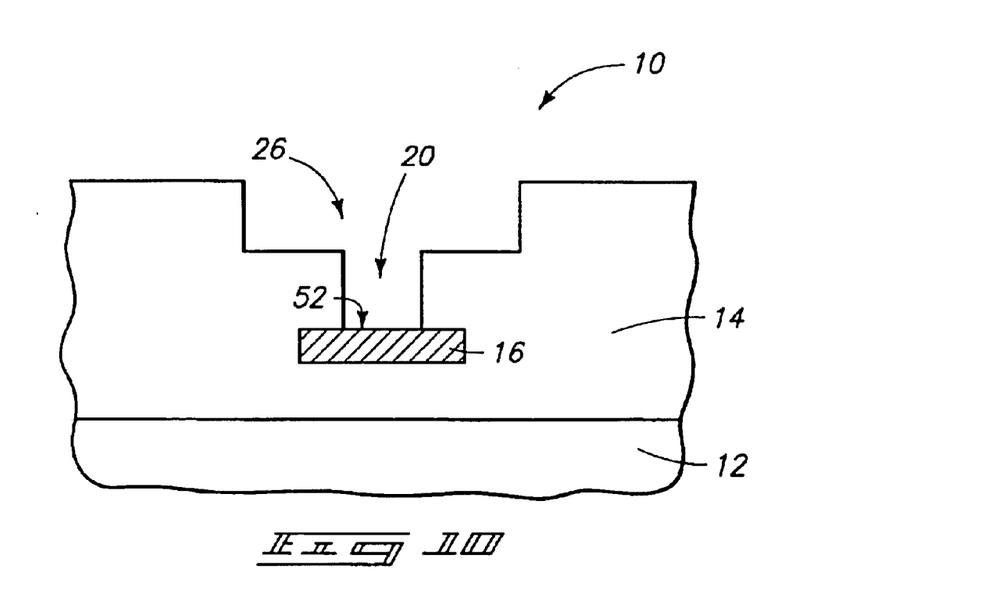
FIG. 10 is a view of the FIG. 6 fragment shown at a processing step subsequent to that of FIG. 9.
Figure 11:
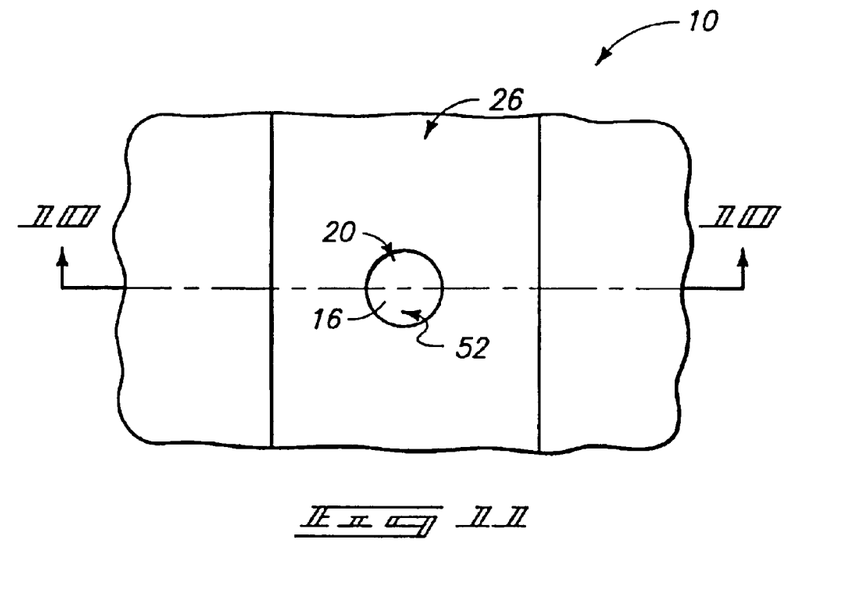
FIG. 11 is a top view of the FIG. 10 construction.

Referring to FIG. 10, masking material 24, mass 24 and mass 60 (FIG. 9) are removed. Such removal can be accomplished by, for example, an oxygen plasma strip. A top view of a portion of the semiconductor wafer comprising fragment 10 is shown in FIG. 11, and such illustrates that opening 20 can be in the form of a via extending to upper surface 52 of conductive material 16, and opening 26 can be in the shape of a slot.

Figure 12:
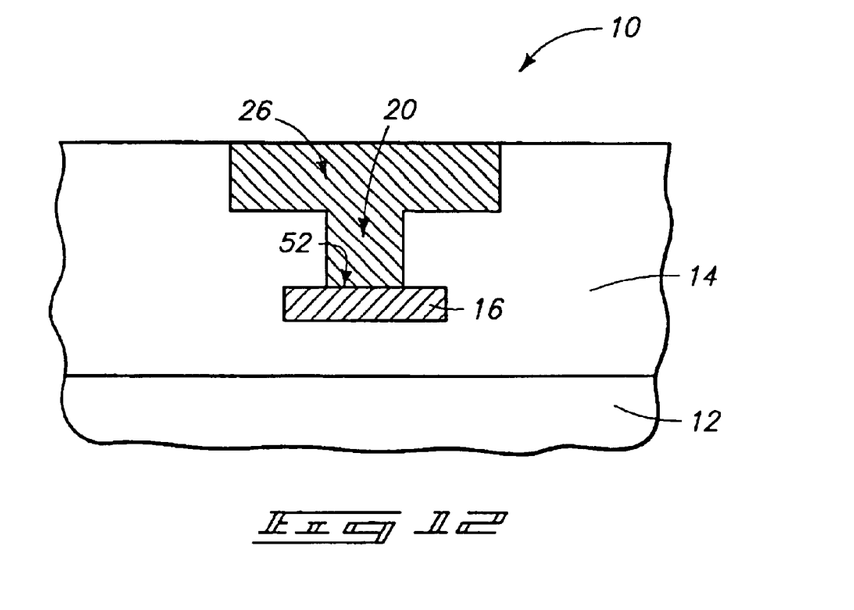
FIG. 12 is a diagrammatic, cross-sectional view of the FIG. 6 fragment shown at a processing step subsequent to that of FIG. 10.

Referring to FIG. 12, openings 20 and 26 are filled with a conductive material 70. The portion of conductive material 70 within slot 26 can be considered a conductive line, and the portion of conductive material 70 within opening 20 can be considered a conductive interconnect which interconnects the conductive line with conductive structure 16. In other words, conductive material 70 can electrically contact conductive structure 16 through openings 26 and 20. Conductive material 70 can comprise a metal, and, for example, can comprise, consist essentially of, or consist of copper.

In particular embodiments, conductive structure 16 can comprise a first metal layer, and the conductive line formed within slot 26 can comprise a second metal layer, with such metal layers being electrically connected to one another through the conductive material within via 20. The first metal layer can comprise a metal I layer and the second metal layer a metal II layer, alternatively, the first metal layer can comprise a higher level metal layer (such as, for example, a metal II, metal III, metal IV, metal V, etc. layer) and the second metal layer can comprise another metal layer above the first metal layer, such as, for example, a metal III, metal IV, metal V, metal VI, etc. layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor construction, comprising:
    a semiconductor substrate which includes a conductive mass and an insulative mass over the conductive mass;
    an opening extending through the insulative mass and to the conductive mass;
    a first organic material within the opening and covering the conductive mass, the first organic material only partially filling the opening; and
    a second organic material within the opening and over the first organic material, the second organic material being compositionally different than the first organic material at least in that the second organic material comprises more cross-links than any cross-links in the first organic material.

2. The construction of claim 1 wherein the conductive mass comprises a metal.
3. The construction of claim 1 wherein the conductive mass comprises copper.
4. The construction of claim 1 wherein the conductive mass consists essentially of copper.
5. The construction of claim 1 wherein the insulative mass comprises borophosphosilicate glass.
6. The construction of claim 1 wherein the insulative mass comprises borophosphosilicate glass, and wherein the conductive mass consists essentially of copper.
7. A semiconductor construction, comprising:
    a semiconductor substrate including a conductive mass and an insulative mass over the conductive mass;
    an opening extending through the insulative mass to the conductive mass;
    a first organic material provided in the opening and directly over the conductive mass to cover the conductive mass, wherein the first organic material is provided to partially fill the opening in the conductive mass;
    a second organic material provided in the opening and directly over the first organic material, wherein the second organic material is compositionally different from the first organic material at least in that the second organic material comprises more cross-links than any cross-links in the first organic material; and
    wherein the first and second organic materials are not continuous over the insulative mass.
8. The construction of claim 7 wherein the conductive mass comprises a metal.
9. The construction of claim 7 wherein the conductive mass comprises copper.
10. The construction of claim 7 wherein the conductive mass consists essentially of copper.
11. The construction of claim 7 wherein the insulative mass comprises borophosphosilicate glass.
12. The construction of claim 7 wherein the insulative mass comprises borophosphosilicate glass, and wherein the conductive mass consists essentially of copper.
13. The construction of claim 1, wherein the cross-links in the second organic material alter the chemical properties of the second organic material.
14. The construction of claim 13, wherein the cross-links are within a portion of the second organic material that is adjacent the first organic material.
15. The construction of claim 14, wherein the cross-links are configured to selectively harden the portion of the second organic material relative to other portions of the second organic material that are not adjacent the first organic material.
16. The construction of claim 15, wherein the cross-links are chemical cross-links.

* * * * *